US00RE45761E

(19) United States
(12) Reissued Patent
Arik et al.

(10) Patent Number: US RE45,761 E
(45) Date of Reissued Patent: *Oct. 20, 2015

(54) METHOD AND APPARATUS FOR REDUCING ACOUSTIC NOISE IN A SYNTHETIC JET

(71) Applicant: General Electric Company, Schenectady, NY (US)

(72) Inventors: Mehmet Arik, Uskudar Instanbul (TR); Stanton Earl Weaver, Northville, NY (US); Charles Erklin Seeley, Niskayuna, NY (US); Yogen Vishwas Utturkar, Niskayuna, NY (US)

(73) Assignee: General Electric Company, Schenectady, NY (US)

( * ) Notice: This patent is subject to a terminal disclaimer.

(21) Appl. No.: 14/013,834

(22) Filed: Aug. 29, 2013

Related U.S. Patent Documents

Reissue of:
(64) Patent No.: 8,006,917
Issued: Aug. 30, 2011
Appl. No.: 12/198,240
Filed: Aug. 26, 2008

(51) Int. Cl.
*B05B 1/08* (2006.01)
*B05B 17/06* (2006.01)

(52) U.S. Cl.
CPC ..... *B05B 17/0607* (2013.01)

(58) Field of Classification Search
CPC ..... B05B 17/0607
USPC ..... 239/102.2, 102.1, 4, 11, 589.1, 589
See application file for complete search history.

(56) References Cited

U.S. PATENT DOCUMENTS

| | | | | |
|---|---|---|---|---|
| 4,702,418 | A * | 10/1987 | Carter et al. | 239/101 |
| 5,758,823 | A | 6/1998 | Glezer et al. | |
| 5,894,990 | A | 4/1999 | Glezer et al. | |
| 5,988,522 | A | 11/1999 | Glezer et al. | |
| 6,056,204 | A | 5/2000 | Glezer et al. | |
| 6,123,145 | A | 9/2000 | Glezer et al. | |
| 6,722,581 | B2 | 4/2004 | Saddoughi | |
| 6,801,430 | B1 | 10/2004 | Pokharna | |
| 7,263,837 | B2 | 9/2007 | Smith | |
| 8,308,078 | B2 * | 11/2012 | Arik et al. | 239/102.2 |

OTHER PUBLICATIONS

Arik, "An investigation into feasibility of impingement heat tranfer and acoustic abatement of meso scale synthetic jets," Applied Thermal Engineering, 2007, vol. 27, pp. 2483-1494.
Utturkar et al., "An Experimental and Computational Heat Transfer Study of Pulsating Jets," Journal of Heat Transfer, Jun. 2008, vol. 130.
Garg et al., "Meso Scale Pulsating Jets for Electronics Cooling", Dec. 2005.

* cited by examiner

*Primary Examiner* — Davis Hwu
(74) *Attorney, Agent, or Firm* — Ziolkowski Patent Solutions Group, SC; Jean K. Testa

(57) ABSTRACT

A synthetic jet includes a first backer structure and a first actuator coupled to the first backer structure to form a first composite unit. The synthetic jet also includes a second backer structure, and a second actuator coupled to the second backer structure to form a second composite unit. A wall member is coupled to and positioned between the first and second backer structures to form a cavity. The first composite unit has an orifice formed therethrough and the orifice is fluidically coupled to the cavity and fluidically coupled to an environment external to the cavity.

23 Claims, 4 Drawing Sheets

METHOD AND APPARATUS FOR REDUCING ACOUSTIC NOISE IN A SYNTHETIC JET

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND OF THE INVENTION

The invention relates generally to synthetic jets and, more particularly, to a method and apparatus of acoustic noise reduction therein.

A synthetic jet may influence the flow over a surface to control flow, as in, for example, separation from an airfoil, or to enhance convection on a surface. A typical synthetic jet actuator includes a housing defining an internal chamber, and an orifice is present in a wall of the housing. The actuator further includes a mechanism in or about the housing for periodically changing the volume within the internal chamber so that a series of fluid vortices are generated and projected in an external environment out from the orifice of the housing. Various volume changing mechanisms include, for example, a piston positioned in the jet housing to move so that gas or fluid is moved in and out of the orifice during reciprocation of the piston and a flexible diaphragm as a wall of the housing. The flexible diaphragm is typically actuated by a piezoelectric actuator or other appropriate means.

Typically, a control system is utilized to create time-harmonic motion of the diaphragm. As the diaphragm moves into the chamber, decreasing the chamber volume, fluid is ejected from the chamber through the orifice. As the fluid passes through the orifice, the flow separates at the sharp edges of the orifice and creates vortex sheets which roll up into vortices. These vortices move away from the edges of the orifice under their own self-induced velocity. As the diaphragm moves outward with respect to the chamber, increasing the chamber volume, ambient fluid is drawn from large distances from the orifice into the chamber. Because the exiting vortices get connected away from the edges of the orifice, they are not affected by the ambient fluid being entrained into the chamber. Thus, as the vortices travel away from the orifice, they synthesize a jet of fluid, thus called a "synthetic jet," through entrainment of the ambient fluid.

A synthetic jet may be used for thermal management of tight spaces where electronics may be housed and where space for the electronics is a premium. Typically, wireless communication devices such as cellular phones, pagers, two-way radios, and the like, have much of their heat generated in integrated circuit (i.e. IC) packages that are positioned in such tight spaces. Because of the limited space and limited natural convection therein, the heat generated is typically conducted into printed circuit boards and then transferred to the housing interior walls via conduction, convection, and radiative processes. The heat is then typically conducted through the housing walls and to the surrounding ambient environment. The process is typically limited because of the limited opportunity for convection cooling within the housing and over the printed circuit boards. The low thermal conductivity of the fiberglass epoxy resin-based printed circuit boards can lead to high thermal resistance between the heat source and the ambient environment. And, with the advent of smaller enclosures, higher digital clock speeds, greater numbers of power-emitting devices, higher power-density components, and increased expectations for reliability, thermal management issues present an increasing challenge in microelectronics applications.

To improve the heat transfer path, micro/meso scale devices such as synthetic jets have been proposed as a possible replacement for or augmentation of natural convection in microelectronics devices. Applications may include impingement of a fluid in and around the electronics and printed circuit boards. However, a synthetic jet typically has two natural frequencies at which the synthetic jet yields superior cooling performance. These natural frequencies include the structural resonant frequency and the acoustic resonance (Helmholtz) frequency. The structural resonant frequency is caused at the natural frequency of the structure of the synthetic jet, which consists typically of the synthetic jet plates acting as a mass and the elastomeric wall acting as a spring. The acoustic resonance frequency is characterized by the acoustic resonance of air mass flowing in and out of the synthetic jet orifice. The effect is due to the air in the synthetic jet volume acting as a spring and the air in the orifice acting as a mass. The acoustic resonance is expectedly accompanied by a loud tonal noise and a determined vibrational mode if the two modes are not separated from one another in the frequency domain. Thus, the process of operating a synthetic jet typically results in a loud noise that may limit or preclude its use in cooling and other applications.

Therefore, it would be desirable to design an apparatus and method for reducing acoustic noise in a synthetic jet while not compromising performance thereof.

BRIEF DESCRIPTION OF THE INVENTION

Embodiments of the invention provide a method and apparatus that overcome the aforementioned drawbacks. Embodiments of the invention are directed method and apparatus for reducing acoustic noise in a synthetic jet while not compromising performance thereof.

According to one aspect of the invention, a synthetic jet includes a first backer structure and a first actuator coupled to the first backer structure to form a first composite unit. The synthetic jet also includes a second backer structure, and a second actuator coupled to the second backer structure to form a second composite unit. A wall member is coupled to and positioned between the first and second backer structures to form a cavity. The first composite unit has an orifice formed there through and the orifice is fluidically coupled to the cavity and fluidically coupled to an environment external to the cavity.

In accordance with another aspect of the invention, a method of fabricating a synthetic jet includes attaching two plates to a wall to encircle a volume and coupling a first micromechanical device to one of the two plates to form a first unitary member. The method also includes coupling a second micromechanical device to the other of the two plates to form a second unitary member and penetrating an orifice through the first unitary member to fluidically couple the volume to a gas outside the volume.

Yet another aspect of the invention includes a system for cooling a device that includes a synthetic jet. The synthetic jet includes a first plate, a first actuator coupled to the first plate, a second plate, a second actuator coupled to the second plate, and a wall member coupled to and positioned between the first and second plates to form a cavity. The first plate and the first actuator have an orifice penetrating therethrough, and the orifice is fluidically coupled to the cavity and fluidically coupled to an environment external to the cavity. The system includes at least one control system configured to drive the first and second actuators at an electrical frequency such that a jet expels from the orifice.

Various other features and advantages will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Embodiments of the invention relate to a piezoelectric motive device and methods of making and using a piezoelectric motive device to reduce the acoustic noise emitting therefrom. The operating environment is described with respect to a thermal management system for enhancing convection in cooling of electronics. However, it will be appreciated by those skilled in the art that embodiments of the invention are equally applicable for use with other synthetic jet applications. For instance, synthetic jets have been routinely used for stand-point flow control, thrust vectoring of jets, triggering turbulence in boundary layers, and other heat transfer applications. Heat transfer applications may include direct impingement of vortex dipoles on heated surfaces and employing synthetic jets to enhance the performance of existing cooling circuits. Thus, although embodiments of the invention are described with respect to cooling of electronics, they are equally applicable to systems and applications using synthetic jets for other purposes.

Figure 1:
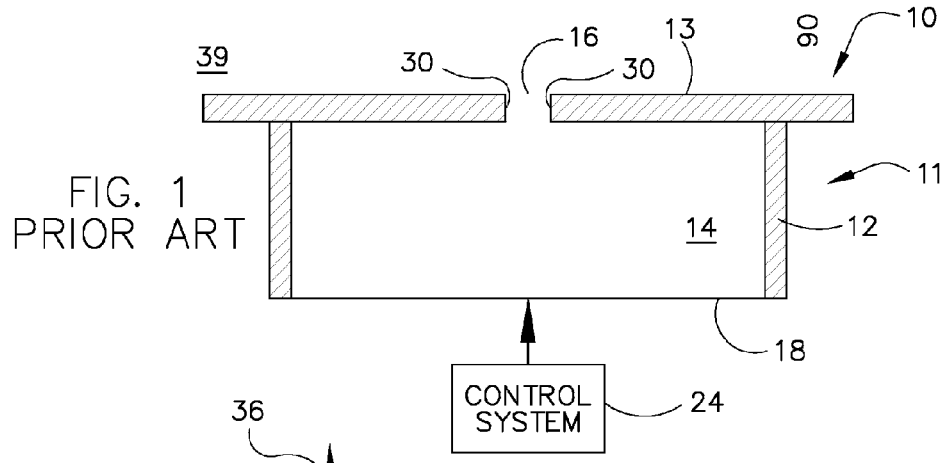
FIG. 1 PRIOR ART
FIG. 1 is a schematic cross-sectional side view of a prior art zero net mass flux synthetic jet actuator with a control system.
Figure 2:
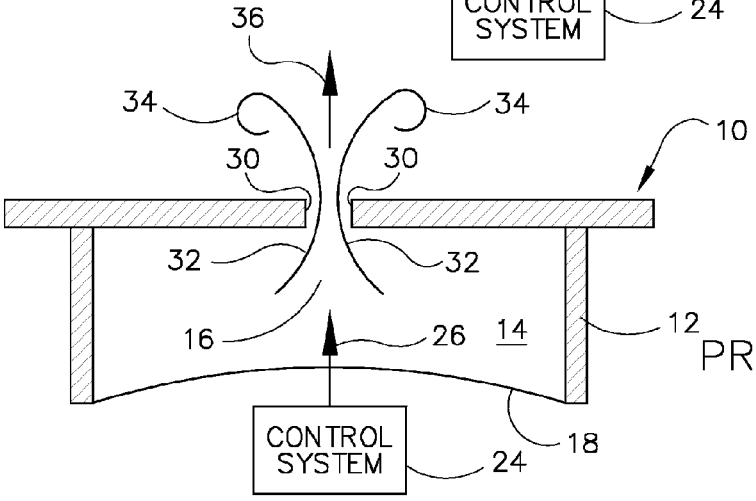
FIG. 2 PRIOR ART
FIG. 2 is a schematic cross-sectional side view of the synthetic jet actuator of FIG. 1 depicting the jet as the control system causes the diaphragm to travel inward, toward the orifice.
Figure 3:
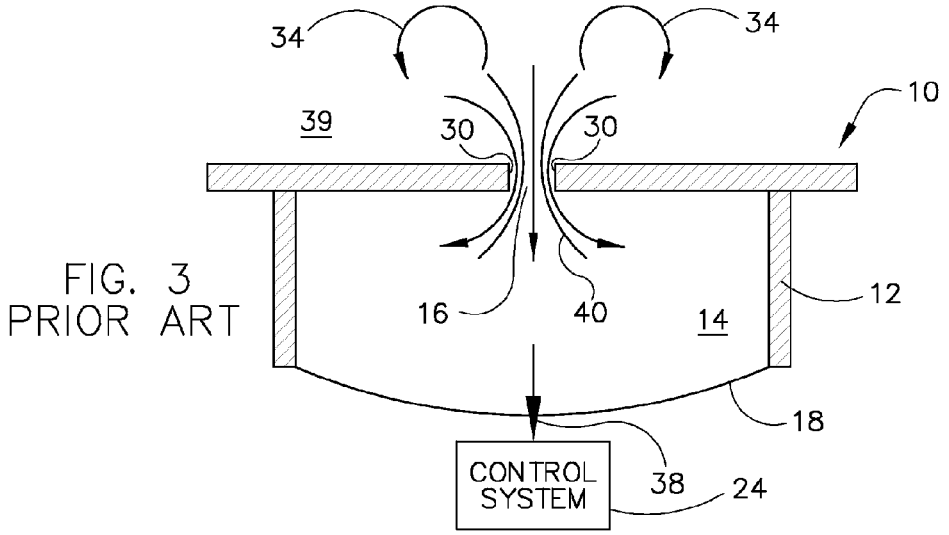
FIG. 3 PRIOR ART
FIG. 3 is a schematic cross-sectional side view of the synthetic jet actuator of FIG. 1 depicting the jet as the control system causes the diaphragm to travel outward, away from the orifice.

Referring to FIGS. 1-3, a synthetic jet 10 as known in the art, and the operation thereof, is shown. The synthetic jet 10 includes a housing 11 defining and enclosing an internal chamber 14. The housing 11 and chamber 14 can take virtually any geometric configuration, but for purposes of discussion and understanding, the housing 11 is shown in cross-section in FIG. 1 to have a rigid side wall 12, a rigid front wall 13, and a rear diaphragm 18 that is flexible to an extent to permit movement of the diaphragm 18 inwardly and outwardly relative to the chamber 14. The front wall 13 has an orifice 16 of any geometric shape. The orifice diametrically opposes the rear diaphragm 18 and connects the internal chamber 14 to an external environment having ambient fluid 39.

The flexible diaphragm 18 may be controlled to move by any suitable control system 24. For example, the diaphragm 18 may be equipped with a metal layer, and a metal electrode may be disposed adjacent to but spaced from the metal layer so that the diaphragm 18 can be moved via an electrical bias imposed between the electrode and the metal layer. Moreover, the generation of the electrical bias can be controlled by any suitable device, for example but not limited to, a computer, logic processor, or signal generator. The control system 24 can cause the diaphragm 18 to move periodically, or modulate in time-harmonic motion, and force fluid in and out of the orifice 16. Alternatively, a piezoelectric actuator could be attached to the diaphragm 18. The control system would, in that case, cause the piezoelectric actuator to vibrate and thereby move the diaphragm 18 in time-harmonic motion.

The operation of the synthetic jet 10 is described with reference to FIGS. 2 and 3. FIG. 2 depicts the synthetic jet 10 as the diaphragm 18 is controlled to move inward into the chamber 14, as depicted by arrow 26. The chamber 14 has its volume decreased and fluid is ejected through the orifice 16. As the fluid exits the chamber 14 through the orifice 16, the flow separates at sharp orifice edges 30 and creates vortex sheets 32 which roll into vortices 34 and begin to move away from the orifice edges 30 in the direction indicated by arrow 36.

FIG. 3 depicts the synthetic jet 10 as the diaphragm 18 is controlled to move outward with respect to the chamber 14, as depicted by arrow 38. The chamber 14 has its volume increased and ambient fluid 39 rushes into the chamber 14 as depicted by the set of arrows 40. The diaphragm 18 is controlled by the control system 24 so that when the diaphragm 18 moves away from the chamber 14, the vortices 34 are already removed from the orifice edges 30 and thus are not affected by the ambient fluid 39 being drawn into the chamber 14. Meanwhile, a jet of ambient fluid 39 is synthesized by the vortices 34 creating strong entrainment of ambient fluid drawn from large distances away from the orifice 16.

Figure 4:
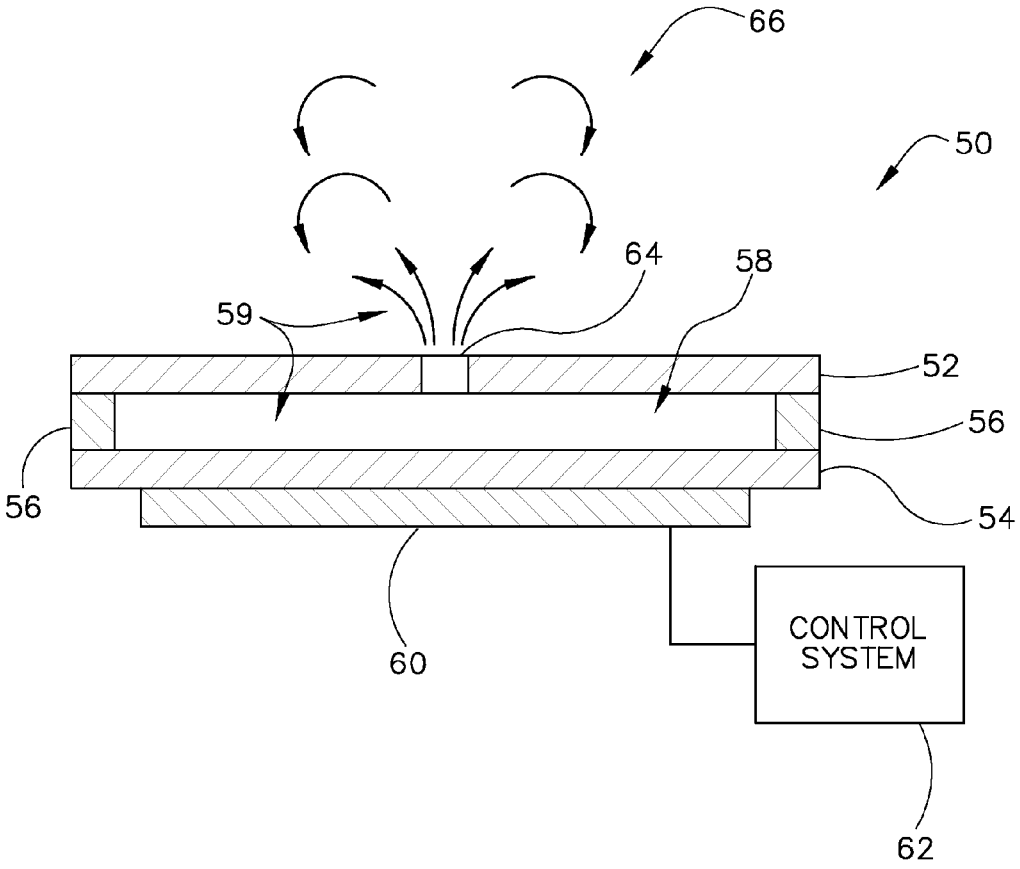
FIG. 4 PRIOR ART
FIG. 4 is an illustration of a cross-section of a synthetic jet.

FIG. 4 illustrates a cross-section of one embodiment of a synthetic jet 50 known in the art. Synthetic jet 50 includes first and second plates 52, 54 separated by a wall 56. A cavity 58 having a gas or fluid 59 therein is encircled by first and second plates 52, 54 and wall 56. A piezoelectric motive device 60 is coupled to second plate 54 and is controlled by a control system 62. An orifice 64 is positioned in first plate 52. During operation, control system 62 causes actuator 60 to move periodically in a time-harmonic motion, thus forcing fluid 59 in and out of cavity 58 through orifice 64, causing a jet 66 to emit therefrom.

Figure 5:
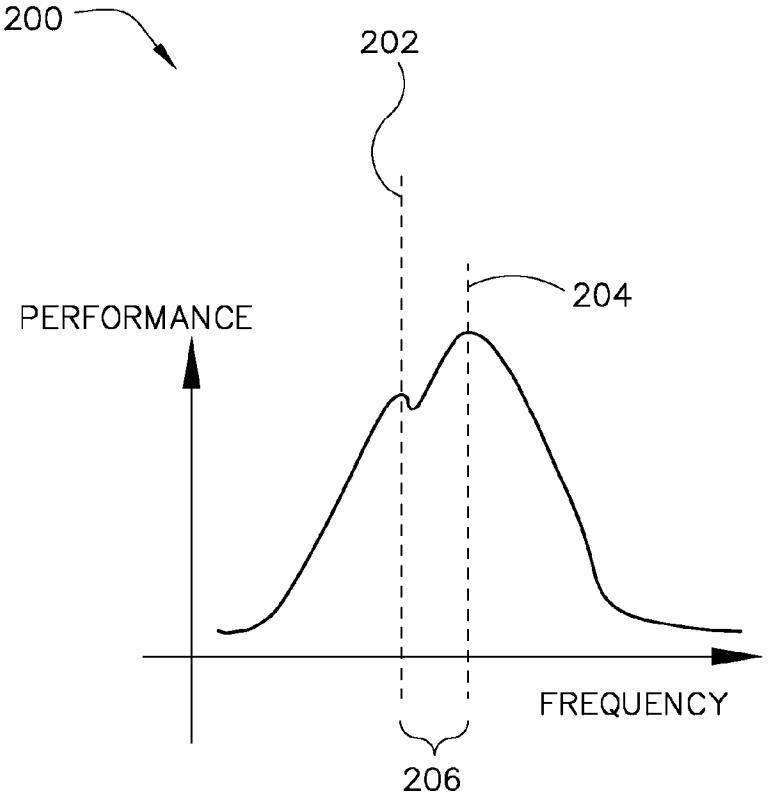

FIG. 5 shows a plot 200 of frequencies for synthetic jet 50 of FIG. 4. As illustrated, synthetic jet 50 has two natural frequencies: a peak structural resonant frequency illustrated at 202 and a peak Helmholtz frequency illustrated at 204. The peak structural resonant frequency 202 is caused at the natural frequency of the structure of the synthetic jet 50, which typically includes the synthetic jet plates 52, 54 acting as a mass and the wall 56 acting as a spring. The peak Helmholtz frequency 204 is characterized by acoustic resonance of air mass in and out of the orifice 64 of the synthetic jet 50. The Helmholtz frequency 204 occurs as a result of the air in the synthetic jet volume acting as a spring and may be accompanied by a loud tonal noise and a determined vibrational mode. A narrow separation 206 between the two frequencies 202, 204, of less than a [few] hundred Hz, may lead to the accompaniment of a loud tonal noise while still providing superior cooling. This tends to preclude its use in cooling and other applications.

Figure 6:
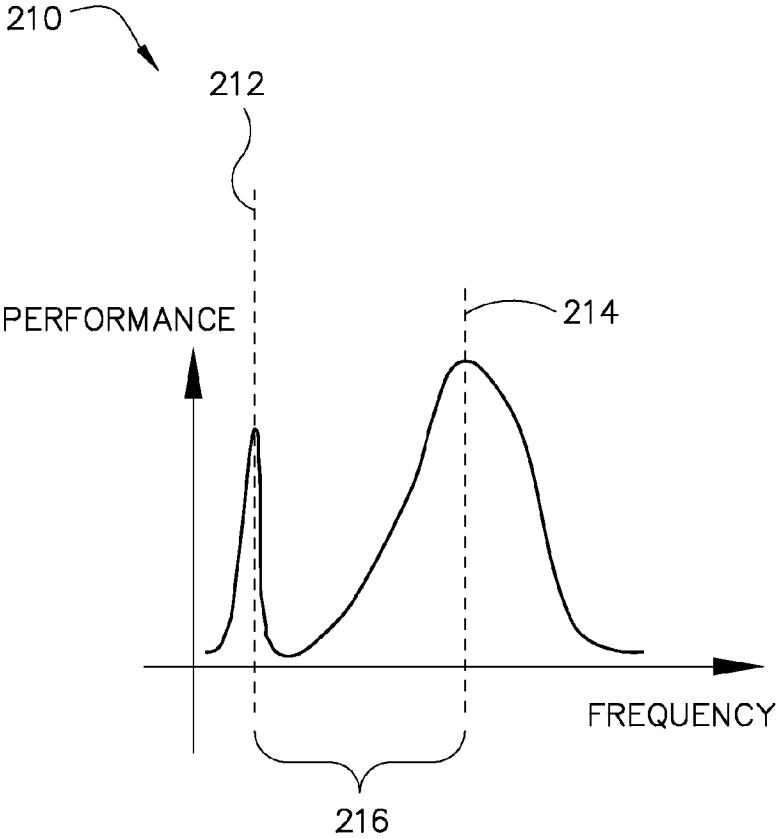
FIGS. 5 and 6 illustrate performance curves for a synthetic jet having both a structural mode and a Helmholtz mode.

The acoustic noise may be reduced in a structure wherein the peak structural resonant frequency 202 and the peak Helmholtz frequency 204 are separated from one another by an appreciable band gap of, for instance, a few *hundred* Hz to a few kHz, or more. The band gap leads to low-noise cooling by enabling operation of the jet 50 at the structural resonant frequency 202, which gets de-tuned from the acoustically active frequency range. FIG. 6 shows a plot 210 of frequencies where the peak structural resonant frequency 212 and the peak Helmholtz frequency 214 are separated from one another such that noise is reduced by operating the jet 50 at a low resonant frequency. A separation 216 represents the separation between the two peaks 212, 214 and results in a separation of two frequencies of a few hundred Hz or more. While the peak Helmholtz frequency 214 is shown in FIG. 6 as having a frequency greater than the peak structural resonant frequency 212, noise reduction in a synthetic jet may be equally achieved in a device having an adequate separation where the peak Helmholtz frequency 214 is less than the peak structural resonant frequency 212. The amount of separation may be a few hundred Hz or more, depending on the device structural design and the noise requirements thereof.

Figure 7:
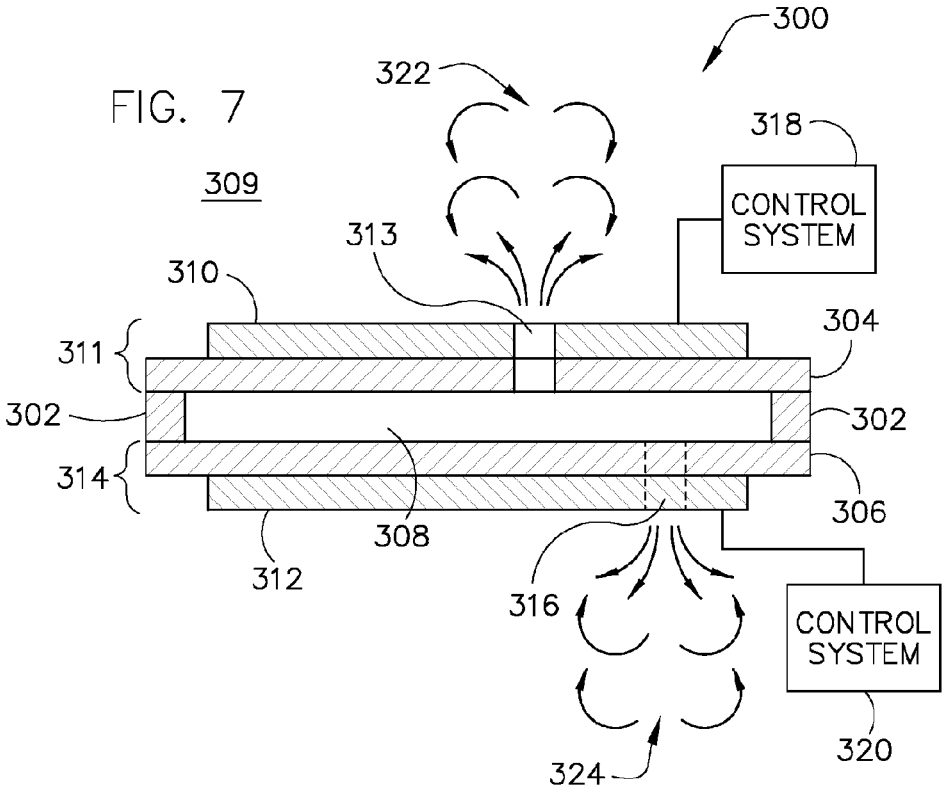
FIG. 7 is an illustration of a cross-section of a synthetic jet according to an embodiment of the invention.

FIG. 7 illustrates a cross-section of a synthetic jet 300 according to an embodiment of the invention. Synthetic jet 300 includes a wall 302 and first and second backer plates 304, 306. The plates 304, 306 are coupled to wall 302 to enclose a cavity 308. A first actuator 310 is coupled to the first plate 304 to form a first unitary member or composite unit or structure 311. A second actuator 312 is coupled to the second plate 306 to form a second unitary member or composite unit or structure 314. An orifice 313 passes through both plate 304 and actuator 310 of first composite 311 and fluidly couples cavity 308 to an exterior volume 309. Orifice 313 may be centrally positioned in composite 311 or may instead be placed in other locations of composite 311. According to an embodiment of the invention, an additional orifice 316 may be positioned in second composite 314. Furthermore, it is contemplated that one or both composites 311, 314 may have one or multiple orifices therein, depending on the application and the desired location(s) of the jets emitting therefrom.

In one embodiment, actuators 310, 312 are piezoelectric motive (piezomotive) devices that may be actuated by application of a rapidly alternating voltage that causes the piezomotive devices to rapidly expand and contract. A pair of control systems 318, 320 are coupled to piezomotive actuators 310, 312, respectively, and provide rapidly alternating voltages to the piezomotive actuators 310, 312. Piezomotive actuators 310, 312 may be monomorph or bimorph devices. In a monomorph embodiment, piezomotive actuators 310, 312 may be coupled to plates 304, 306 formed from materials including metal, plastic, glass, or ceramic. In a bimorph embodiment, one or both piezomotive actuators 310, 312 may be bimorph actuators coupled to plates 304, 306 formed from piezoelectric materials. In an alternate embodiment, the bimorph may include single actuators 310, 312, and plates 304, 306 are the second actuators, thus in this embodiment the composites 311, 314 may themselves make up the bimorph.

The actuation of piezomotive actuators 310, 312 coupled to respective backer plates 304, 306, causes a rapid flexing of the composites 311, 314, which causes a volume change in cavity 308 that causes an interchange of gas or other fluid between cavity 308 and exterior volume 309. For example, when the volume of cavity 308 decreases, a jet 322 of gas emits from cavity 308 through orifice 313 and into exterior volume 309. An increase in the volume of cavity 308 causes gas from exterior volume 309 to flow into cavity 308 through orifice 313. Likewise, in an embodiment having multiple orifices, such as orifice 313 and orifice 316, actuation of piezomotive actuators 310, 312 causes jets 322, 324 to emit from both orifices 313, 316 when the volume of cavity 308 decreases.

In an embodiment of the invention, actuators 310, 312 may include devices other than piezoelectric motive devices, such as hydraulic, pneumatic, magnetic materials, electrostatic materials, and ultrasonic materials. Thus, in such embodiments, control systems 318, 320 are configured to activate respective actuators 310, 312 in corresponding fashion. That is, for an electrostatic material, controllers 318, 320 may be configured to provide a rapidly alternating electrostatic voltage to actuators 310, 312 in order to activate and flex composites 311, 314. Such additional materials may themselves be configured in monomorph and bimorph arrangements.

In order to reduce acoustic noise emission from the jet 300, the peak structural frequency and the peak Helmholtz frequency may be separated by proper selection of materials and material combinations, and appropriate dimensioning. In one embodiment, the materials and dimensions are selected in order to cause the peak structural frequency to be below the peak Helmholtz frequency, and in another embodiment the materials and dimensions are selected in order to cause the peak structural frequency to be above the peak Helmholtz frequency. Optimal acoustic noise reduction may be obtained by separating the two peak frequencies by a few hundred Hz or more.

As discussed above, plates 304, 306 may be formed from metal, plastic, glass, and ceramic. Likewise, wall 302 may be formed from a metal, plastic, glass, and ceramic. Suitable metals include materials such as nickel, aluminum, copper, and molybdenum, or alloys such as stainless steel, brass, bronze, and the like. Suitable polymers and plastics include thermoplastics such as polyolefins, polycarbonate, thermosets, epoxies, urethanes, acrylics, silicones, polyimides, and photoresist-capable materials, and other resilient plastics. Suitable ceramics include titanates (such as lanthanum titanate, bismuth titanate, and lead zirconate titanate) and molybdates. Furthermore, various other components of the synthetic jet 300 may be formed from metal as well.

Thus, for an embodiment having the peak Helmholtz frequency below the peak structural frequency, in order to increase the separation between the two frequencies, the structure of synthetic jet 300 may be stiffened using, for instance, metals and alloys thereof or ceramics for the plates 304, 306. The separation may be enhanced by, for instance, increasing the thickness-to-diameter ratio of the components as well.

Similarly, for a design having the peak Helmholtz frequency above the peak structural frequency, in order to increase the separation between the two frequencies, compliance or pliability may be added to the structure of synthetic jet 300 to decrease the peak structural frequency using, for instance, plastics and polymers for the plates 304, 306. The separation may be enhanced by, for instance, decreasing the thickness-to-diameter ratio of the components as well.

The synthetic jet components may be adhered together or otherwise attached to one another using adhesives, solders, and the like. In one embodiment, a thermoset adhesive or an electrically conductive adhesive is employed to bond actuators 310, 312 to plates 304, 306 to form first and second composite structures 311, 314. In the case of an electrically conductive adhesive, an adhesive may be filled with an electrically conductive filler such as silver, gold, and the like, in order to attach lead wires (not shown) to the synthetic jet. Suitable adhesives may have hardnesses in the range of Shore A hardness of 100 or less and may include silicones, polyurethanes, thermoplastic rubbers, and the like, such that an operating temperature of 120° or greater may be achieved.

Figure 8:
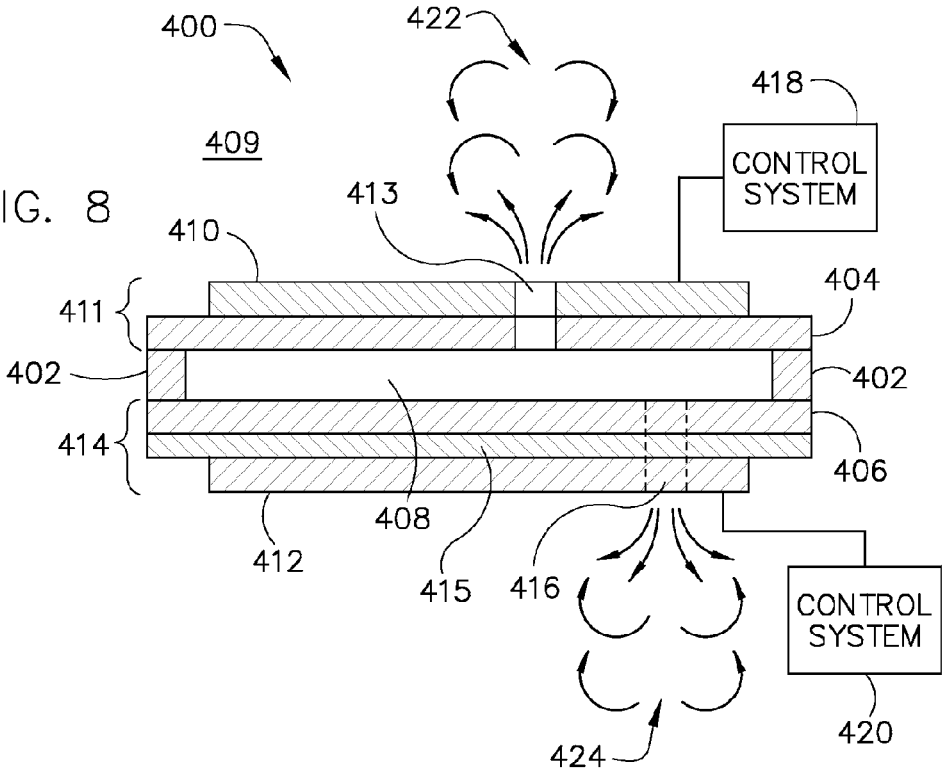
FIG. 8 is an illustration of a cross-section of a synthetic jet according to an embodiment of the invention.

FIG. 8 illustrates a synthetic jet 400 according to another embodiment of the invention. Synthetic jet 400 includes a wall 402 and first and second backer plates 404, 406. The plates 404, 406 are coupled with wall 402 to enclose a cavity 408. A first actuator 410 is coupled to the first plate 404 to form a first composite 411, and a second actuator 412 is coupled to the second plate 406 to form a second composite 414.

As discussed above with respect to FIG. 7, the peak structural frequency and the peak Helmholtz frequency of synthetic jet 400 may be separated by proper selection of materials and material combinations of its components. In addition, an additional backer structure or shim 415 is positioned in second composite 414 between and coupled to the second backer plate 406 and the second actuator 412 to add further separation between the peak structural frequency and the peak Helmholtz frequency. Shim 415 may be made of material that is appropriately selected to increase separation between the structural and Helmholtz modes, as described above. Orifice 413 and orifice 416 (shown in phantom) are configured to pass through the respective composites 411, 414 and may be centrally or non-centrally positioned. Orifices 413, 416 are configured to emit jets 422, 424, upon activation of actuators 410, 412 via respective control systems 418, 420. It is contemplated that one or both composites 411, 414 may have multiple orifices therein, depending on the application and the desired location(s) of the jets emitting therefrom. Additionally, while not illustrated, a shim may also be positioned as part of the first composite 411.

As with the embodiment illustrated in FIG. 7, the actuators 410, 412 may be piezoelectric motive devices, and may include either monomorph or bimorph configurations. Thus, either or both actuators 410, 412 may be bimorph devices, or each actuator 410, 412 may include single actuators, and respective backer plates 404, 406, or shim 415 in the case of composite 414, may be configured as actuators, and each composite 411, 414 may be configured as bimorphs. Likewise, actuators 410, 412 may include materials other than piezoelectric motive devices and respective controllers 418, 420. Components may be adhered via adhesives or solder as described with respect to the embodiment described regarding FIG. 7.

To further reduce the noise thereof, multiple synthetic jets, according to the embodiments described herein, may be each operated with frequencies that are out of phase with one another. In other words, a first synthetic jet may have an actuator therein that is operated at a first frequency, and a second synthetic jet may have an actuator therein that are operated at a second frequency that is out-of-phase with the first frequency, thus producing an overall reduced noise compared to operation of both in-phase with one another.

Additionally, embodiments of the synthetic jets described herein may be configured to be circular, oval, square, rectangular, or other shapes, depending on the application and the space available for mounting the synthetic jets. Likewise, the orifices themselves may include square, circular, oblong, and other shapes depending on the application.

According to one embodiment of the invention, a synthetic jet includes a first backer structure and a first actuator coupled to the first backer structure to form a first composite unit. The synthetic jet also includes a second backer structure, and a second actuator coupled to the second backer structure to form a second composite unit. A wall member is coupled to and positioned between the first and second backer structures to form a cavity. The first composite unit has an orifice formed therethrough and the orifice is fluidically coupled to the cavity and fluidically coupled to an environment external to the cavity.

In accordance with another embodiment of the invention, a method of fabricating a synthetic jet includes attaching two plates to a wall to encircle a volume and coupling a first micromechanical device to one of the two plates to form a first unitary member. The method also includes coupling a second micromechanical device to the other of the two plates to form a second unitary member and penetrating an orifice through the first unitary member to fluidically couple the volume to a gas outside the volume.

Yet another embodiment of the invention includes a system for cooling a device that includes a synthetic jet. The synthetic jet includes a first plate, a first actuator coupled to the first plate, a second plate, a second actuator coupled to the second plate, and a wall member coupled to and positioned between the first and second plates to form a cavity. The first plate and the first actuator have an orifice penetrating therethrough, and the orifice is fluidically coupled to the cavity and fluidically coupled to an environment external to the cavity. The system includes at least one control system configured to drive the first and second actuators at an electrical frequency such that a jet expels from the orifice.

The invention has been described in terms of the preferred embodiment, and it is recognized that equivalents, alternatives, and modifications, aside from those expressly stated, are possible and within the scope of the appending claims.

What is claimed is:

1. A method of fabricating a synthetic jet comprising:

attaching two plates to a wall to [encircle] *form* a volume;

coupling a first micromechanical device to one of the two plates to form a first unitary member;

coupling a second micromechanical device to the other of the two plates to form a second unitary member;

[penetrating] *forming* an orifice through both the first micromechanical device and the plate coupled thereto to fluidically couple the volume to a [gas] *fluid* outside the volume; and coupling a first controller to the first unitary member, wherein the first controller is configured to operate the first unitary member at a first frequency and to operate the second unitary member at a second frequency that is different from the first frequency.

2. The method of claim 1 further comprising attaching a shim to the second unitary member.

3. The method of claim 2 wherein attaching the shim to the second unitary member comprises attaching the shim to the second unitary member via one of a thermoset adhesive, and a solder material.

4. The method of claim 1 wherein at least one of the micromechanical devices is a monomorph piezoelectric device.

5. The method of claim 1 wherein at least one of the micromechanical devices is a bimorph piezoelectric device.

6. A system for cooling a device comprising:

a synthetic jet comprising:

a first plate;

a first actuator coupled to the first plate;

a second plate;

a second actuator coupled to the second plate;

a wall member coupled to and positioned between the first and second plates to form a cavity; [and]

wherein the first plate and the first actuator have an orifice [penetrating] therethrough, the orifice fluidically coupled to the cavity and fluidically coupled to an environment external to the cavity; and at least one control system configured to drive the first and second actuators at electrical frequencies that are different from one another such that a jet expels from the orifice.

7. The system of claim 6 wherein the at least one control system includes a first control system to drive the first actuator and a second control system to drive the second actuator.

8. The system of claim 7 wherein the electrical frequencies provided to the first and second actuators are out-of-phase with one another.

9. The system of claim 7 wherein the electrical frequencies are below 100 Hz or above 20 kHz.

10. The system of claim 6 further comprising attaching a shim to the first actuator.

11. The system of claim 10 wherein the shim is positioned between the first actuator and the one of the first plate.

12. The system of claim 6 wherein at least one of the first and second actuators is one of a monomorph and a bimorph piezoelectric device.

13. The system of claim 6 wherein at least one of the first and second actuators is a hydraulic, a pneumatic, a magnetic material, an electrostatic material, and an ultrasonic material.

*14. The system of claim 6 further comprising a second synthetic jet; and*

*wherein the at least one control system operates the synthetic jets out of phase with one another.*

*15. A synthetic jet comprising:*

*two plates attached to a wall to form a volume;*

*a first micromechanical device coupled to one of the two plates;*

*a second micromechanical device coupled to the other of the two plates; and*

*a control system to operate the first micromechanical device at a frequency out of phase from that of the second micromechanical device; and*

*wherein the first micromechanical device and the plate coupled thereto have an orifice formed therethrough.*

*16. The synthetic jet of claim 15 further comprising a shim attached to one of the two plates.*

*17. The synthetic jet of claim 15 wherein the second micromechanical device and the plate coupled thereto have an orifice formed therethrough to fluidically couple the volume to a fluid outside the volume.*

*18. The synthetic jet of claim 15 wherein the two plates are comprised of at least one of a metal, a polymer, a plastic, a glass, and a ceramic.*

*19. The synthetic jet of claim 15 wherein the first and second micromechanical devices are composed of different materials.*

*20. The synthetic jet of claim 15 wherein the two plates comprise materials selected to de-tune a plurality of natural frequencies of the synthetic jet by separating a band gap therebetween.*

*21. A synthetic jet assembly comprising:*

*a first synthetic jet comprising:*

*a first plurality of plates coupled to a first wall to form a first volume, at least one of the first plurality of plates having an orifice formed therethrough; and*

*a first piezoelectric actuator coupled to a plate of the first plurality of plates;*

*a second synthetic jet comprising:*

*a second plurality of plates coupled to a second wall to form a second volume, at least one of the second plurality of plates having an orifice formed therethrough; and*

*a second piezoelectric actuator coupled to a plate of the second plurality of plates; and*

*wherein the first piezoelectric actuator is operated at a first frequency; and*

*wherein the second piezoelectric actuator is operated at a second frequency that is out-of-phase with the first frequency.*

*22. The synthetic jet assembly of claim 21 wherein at least one of the first and second synthetic jets further comprises a shim.*

*23. The synthetic jet assembly of claim 21 wherein at least one of first and second synthetic jets comprises a plurality of piezoelectric actuators.*

* * * * *